United States Patent
Kohmura et al.

(10) Patent No.: US 6,852,299 B2
(45) Date of Patent: Feb. 8, 2005

(54) WATER-REPELLENT POROUS SILICA, METHOD FOR PREPARATION THEREOF AND USE THEREOF

(75) Inventors: Kazuo Kohmura, Sodegaura (JP); Akihiro Okabe, Sodegaura (JP); Takeshi Kubota, Sodegaura (JP); Yoshito Kurano, Sodegaura (JP); Masami Murakami, Sodegaura (JP)

(73) Assignee: Mitsui Chemicals, Inc., Tokyo (JP)

( * ) Notice: Subject to any disclaimer, the term of this patent is extended or adjusted under 35 U.S.C. 154(b) by 137 days.

(21) Appl. No.: 09/959,505

(22) PCT Filed: Apr. 26, 2001

(86) PCT No.: PCT/JP01/03657

§ 371 (c)(1),
(2), (4) Date: Oct. 29, 2001

(87) PCT Pub. No.: WO01/83369

PCT Pub. Date: Nov. 8, 2001

(65) Prior Publication Data

US 2002/0160207 A1 Oct. 31, 2002

(30) Foreign Application Priority Data

Apr. 28, 2000 (JP) ........................................ 2000-130533
Jan. 23, 2001 (JP) ........................................ 2001-14578

(51) Int. Cl.$^7$ ........................... C01B 33/12; C08G 77/24
(52) U.S. Cl. ........................ 423/335; 428/335; 428/336; 428/446; 528/42
(58) Field of Search ................................ 428/332, 336, 428/446; 423/335, 338; 528/42, 335

(56) References Cited

U.S. PATENT DOCUMENTS

| | | | | |
|---|---|---|---|---|
| 4,503,092 A | | 3/1985 | Klebe et al. | 427/213 |
| 5,830,387 A | * | 11/1998 | Yokogawa et al. | 252/62 |
| 5,942,590 A | * | 8/1999 | Burns et al. | 528/10 |
| 6,448,331 B1 | * | 9/2002 | Ioka et al. | 524/859 |

FOREIGN PATENT DOCUMENTS

| | | |
|---|---|---|
| EP | A1 768 352 | 4/1997 |
| EP | A1 890 623 | 1/1999 |
| JP | 56-14413 | 2/1981 |
| JP | 58-181715 | 10/1983 |
| JP | 61-295226 | 12/1986 |
| JP | 2-59415 | 2/1990 |
| JP | 2-107502 | 4/1990 |
| JP | 6-92621 | 4/1994 |
| JP | A7-173434 | 7/1995 |
| JP | 7-196342 | 8/1995 |
| JP | A7-196342 | 8/1995 |
| JP | 8-157643 | 6/1996 |
| JP | A9-176320 | 7/1997 |
| JP | 9-194298 | 7/1997 |
| JP | 9-242717 | 9/1997 |
| JP | 10-25427 | 1/1998 |
| JP | A10-79382 | 3/1998 |
| JP | 10-140047 | 5/1998 |
| JP | A11-323259 | 11/1999 |
| WO | WO 91/11390 | 8/1991 |
| WO | WO 97/35939 | 10/1997 |
| WO | WO 9937705 | 7/1999 |

OTHER PUBLICATIONS

U.S. 2001/00346554 A1 09/870,221.*
Tsuneo Yanagisawa et al.; Bull. Chem. Soc. Jpn., vol. 63, p. 988 (1990).
Q.–H. Xia et al.; Materials Letters, 42, (2000) pp. 102–107.
Hong Yang et al., Nature, vol. 379, (1996) p. 703.
Hong Yang et al., Nature, vol. 381, (1996) p. 589.
S. Schacht et al., Science, vol. 273, (1996) p. 768.

* cited by examiner

*Primary Examiner*—Wayne A. Langel
(74) *Attorney, Agent, or Firm*—Birch, Stewart, Kolasch & Birch, LLP

(57) ABSTRACT

Water-repellent porous silica having uniform pores, which comprises silica skeleton wherein fluorine atoms are fixed through covalent bonds and which has an alkali metal content of not more than 10 ppb, is synthesized. By the water-repellent porous silica, a water-repellent porous silica film having uniform pores, which is applicable to a light functional material or an electron functional material, a process for preparing the same and uses thereof can be provided.

21 Claims, No Drawings

WATER-REPELLENT POROUS SILICA, METHOD FOR PREPARATION THEREOF AND USE THEREOF

This application is the national phase under 35 U.S.C §371 of PCT international Application No. PCT/JP01/03657 which has an International filing date of Apr. 26, 2001, which designated the United States of America.

TECHNICAL FIELD

The present invention relates to water-repellent porous silica having uniform mesopores, that is applicable to catalyst carrier, adsorbent, light functional material, electron functional material and the like, a process for preparing the water-repellent porous silica, and uses of the water-repellent porous silica.

BACKGROUND ART

Porous inorganic compounds having uniform mesopores have larger pores than conventional oxides such as zeolite, and application of those compounds to catalyst carrier, separation adsorbent, fuel battery and sensor has been studied.

As for a process for preparing such an oxide having uniform mesopores, a process utilizing control of the structure of an inorganic material by the use of an organic compound has been paid attention because an oxide of novel shape and structure can be obtained. In particular, an oxide having uniform mesopores, that is synthesized by utilizing self organization of an organic compound and an inorganic compound, is known to have a larger pore volume and a larger surface area than conventional oxides such as zeolite.

As a process for preparing an oxide having uniform pores utilizing self organization of an organic compound and an inorganic compound, a process comprising subjecting a silica gel and a surface active agent to hydrothermal synthesis reaction in a heat-resistant closed vessel to prepare such an oxide is described in, for example, WO91/11390. In Bull. Chem. Soc. Jp., Vol. 63, p. 988 (1990), a process comprising subjecting kanemite that is a kind of a layered silicate and a surface active agent to ion exchange to prepare such an oxide is described.

On the other hand, the oxide having uniform mesopores has a defect that the oxide is liable to adsorb moisture because of its large pore volume and surface area. That is to say, the oxide having uniform mesopores prepared as described above has a large pore volume and contains a great number of hydroxyl groups present on the pore surfaces. Therefore, the oxide has high moisture adsorption properties, and the structure of the oxide is changed by the adsorbed water or the periodic structure of the pores is disintegrated.

Many patents to improve the moisture adsorption properties have been applied so far. For example, it is described in Japanese Patent Laid-Open Publication No. 14413/1981 that an organosilicon halide compound as a starting material is allowed to react with $SiO_2$ in an organic solvent to develop water repellency. In this case, the organic group imparts water repellency to $SiO_2$.

Surface treatments of silica and a silica gel are described in various publications. In Japanese Patent Laid-Open Publication No. 181715/1983, treatment with an organosilane halide and water vapor is described; in Japanese Patent Laid-Open Publication No. 295226/1986, treatment with silicone or the like is described; in Japanese Patent Laid-Open Publication No. 59415/1990, bonding to a hydrophobic organic group is described; in Japanese Patent Laid-Open Publication No. 107502/1990, treatment with a fluorinating agent in the presence of water is described; in Japanese Patent Laid-Open Publication No. 196342/1995, treatment by immersion of a substrate in a solution obtained by adding $NH_4F$ to a water-based solution of alkoxysilane is described; and in Japanese Patent Laid-Open Publications No. 157643/1996, No. 242717/1997, No. 25427/1998 and No. 140047/1998, treatment of an inorganic oxide with a fluorine-containing organosilicon compound as a surface treating agent is described. All of these methods have improved moisture adsorption properties of silica.

Further, in EP0799791, treatment with a silicone oil having an epoxy group or with an amine compound having an amino group is described; in Chinese Patent No. 1,072,654, treatment using amine or pyrrolidone is described; and in U.S. Pat. No. 4,164,509, sulfonic acid treatment is described. Moreover, in Japanese Patent Laid-Open Publication No. 92621/1994, treatment comprising hydrolyzing tetraethoxysilane and coating a substrate with the hydrolysis solution is described; in U.S. Pat. No. 4,569,833, treatment by contact with $SiF_4$ to improve water repellency is described; and in U.S. Pat. No. 4,054,689, treatment by contact with a HF gas to improve water repellency is described.

The above methods, however, are all surface treatments of silica, and it is difficult to homogeneously treating inside surfaces of pores of the porous silica. In addition, they are not satisfactory as methods to improve moisture adsorption properties of the porous materials from the viewpoint of application of the resulting silica to light functional materials or electron functional materials, because there are disadvantages such that the treatment in water disintegrates the pore structure, the treatment with an organic material results in low heat resistance, and the F treatment by the contact with a gas results in only a temporary effect.

In *Materials Letters* 42 (2000), pp. 102–107, a process for preparing water-repellent porous silica having uniform pores, comprising dropwise adding a HF solution to a caustic soda solution of silica and performing hydrothermal synthesis is described. From the porous silica prepared by this process, however, any film cannot be formed. In addition, Na remaining in silica hinders application of the silica to a light functional material or an electron functional material.

On the other hand, films comprising oxides having uniform mesopores have been proposed recently, and application of those films to light functional materials or electron functional materials has been highly expected. For example, in *Nature*, Vol. 379, p. 703 (1996), a process comprising placing a mica board in a solution essentially consisting of tetraalkoxysilane and a surface active agent to form a film on a surface of the mica is described; in *Nature*, Vol. 381, p. 589 (1996), a process for forming a film on a liquid level of a solution essentially consisting of tetraalkoxysilane and a surface active agent is described; and in *Science*, Vol. 273, p. 768 (1996), a process for forming a film on an interface between an oil layer containing tetraalkoxysilane and a water layer containing a surface active agent is described. These processes, however, industrially have a problem that a long period of time is necessary for the formation of a film and a large amount of a powder is produced as a by-product together with the film.

In Japanese Patent Laid-Open Publication No. 194298/1997, a process comprising coating a substrate with a solution essentially consisting of tetraalkoxysilane and a surface active agent to form a film having pores regularly disposed is disclosed. In WO99/37705, a process for forming a film, which comprises converting a surface active agent into an amphiphatic block copolymer to make pores large, is disclosed. These processes are industrially useful because films are produced for a short period of time. In the resulting porous films having uniform pores, however, gradual variation of the structure or disintegration of the periodic structure of pores takes place because of the aforesaid moisture adsorption properties, and thereby the conductivity becomes high. Thus, these porous films have a problem when they are applied to light functional materials or electron functional materials.

Accordingly, development of a highly water-repellent film having uniform pores has been eagerly desired.

DISCLOSURE OF THE INVENTION

It is an object of the present invention to provide water-repellent porous silica having uniform pores, that is applicable to a light functional material or an electron functional material, and to provide a silica film, a precursor solution for forming the silica, a process for preparing the silica and uses of the silica.

As a result of earnest studies to achieve the above-mentioned object, the present invention has been accomplished.

The water-repellent porous silica according to the present invention is water-repellent porous silica having uniform pores, which comprises silica skeleton wherein fluorine atoms are fixed through covalent bonds and which has an alkali metal content of not more than 10 ppb.

The fluorine content in the silica skeleton is preferably in the range of 0.3 to 15.0% by weight.

It is preferable that the mean pore size of pores of the porous silica is in the range of 1.3 to 10 nm and the porous silica has a periodic crystal structure of hexagonal system when examined by X-ray diffractometry.

It is also preferable that the mean pore size is in the range of 1.3 to 10 nm and the porous silica has a crystal structure of irregular arrangement.

The process of the present invention for preparing the water-repellent porous silica having uniform pores, said silica comprising silica skeleton wherein fluorine atoms are fixed through covalent bonds, comprises the steps of partially hydrolyzing a fluorine-containing trialkoxysilane represented by the following formula and a tetraalkoxysilane under acidic condition, then drying a solution resulting from the hydrolysis and mixed with a surface active agent, and removing the surface active agent or extraction;

$$(ZO)_3SiR$$

wherein Z is methyl, ethyl, n-propyl, i-propyl, n-butyl, t-butyl, i-butyl or sec-butyl, and R is a fluorine atom, $(CH_2)_a(CF_2)_b(O(CF_2)_c)_dX$ (X is a fluorine atom, $OCF_3$, $OCF(CF_3)_2$, $OC(CF_3)_3$, an alkyl group or a phenyl group, a is a number of 0 to 3, b is a number of 0 to 3, c is a number of 1 to 3, and d is a number of 0 to 3) or $C_6H_eF_{(5-e)}$ (e is a number of 0 to 4).

When the desired water-repellent porous silica is a powder, the solution can be dried by spray drying.

The fluorine-containing trialkoxysilane is preferably triethoxyfluorosilane.

The tetraalkoxysilane is preferably tetraethoxysilane.

The molar ratio of the fluorine-containing trialkoxysilane to the tetraalkoxysilane is preferably in the range of 0.01 to 1.2.

The number of moles of the surface active agent is preferably in the range of 0.003 to 1 time the sum of the numbers of moles of the fluorine-containing trialkoxysilane and the tetraalkoxysilane.

The surface active agent is preferably an alkylammonium salt represented by the following formula:

$$C_nH_{2n+1}N(CH_3)_3X$$

wherein n is an integer of 8 to 24, and X is a halide ion, $HSO_4^-$ or an organic anion.

The surface active agent is also preferably a compound having a polyalkylene oxide structure.

The film according to the present invention is a film comprising the water-repellent porous silica.

The thickness of the water-repellent porous silica film is preferably in the range of 0.01 μm to 2.0 mm.

The water-repellent porous silica film can be used as a layer insulation film.

The precursor solution according to the present invention is a precursor solution for forming the water-repellent porous silica.

The precursor solution for forming the water-repellent porous silica is obtained by partially hydrolyzing a fluorine-containing trialkoxysilane represented by the following formula and a tetraalkoxysilane under acidic condition and then mixing the resulting hydrolysis solution with a surface active agent;

$$(ZO)_3SiR$$

wherein Z is methyl, ethyl, n-propyl, i-propyl, n-butyl, t-butyl, i-butyl or sec-butyl, and R is a fluorine atom, $(CH_2)_a(CF_2)_b(O(CF_2)_c)_dX$ (X is a fluorine atom, $OCF_3$, $OCF(CF_3)_2$, $OC(CF_3)_3$, an alkyl group or a phenyl group, a is a number of 0 to 3, b is a number of 0 to 3, c is a number of 1 to 3, and d is a number of 0 to 3) or $C_6H_eF_{(5-e)}$ (e is a number of 0 to 4).

In the precursor solution for the forming water-repellent porous silica, the molar ratio of the fluorine-containing trialkoxysilane to the tetraalkoxysilane is preferably in the range of 0.01 to 1.2.

In the precursor solution for forming the water-repellent porous silica, the number of moles of the surface active agent is preferably in the range of 0.003 to 1 time the sum of the numbers of moles of the fluorine-containing trialkoxysilane and the tetraalkoxysilane.

The surface active agent used for the precursor solution for forming the water-repellent porous silica is preferably an alkylammonium salt represented by the following formula:

$$C_nH_{2n+1}N(CH_3)_3X$$

wherein n is an integer of 8 to 24, and X is a halide ion, $HSO_4^-$ or an organic anion.

The surface active agent used for the precursor solution for forming the water-repellent porous silica is also preferably a compound having a polyalkylene oxide structure.

BEST MODE FOR CARRYING OUT THE INVENTION

The present invention is described in detail hereinafter.

For preparing water-repellent porous silica having uniform pores, which comprises silica skeleton wherein fluorine atoms are fixed through covalent bonds, hydrolysis reaction of a fluorine-containing trialkoxysilane with a tetraalkoxysilane is carried out first.

Through the hydrolysis reaction, the fluorine-containing trialkoxysilane and the tetraalkoxysilane are co-condensed, and fluorine atoms to develop water repellency are highly dispersed and fixed in the copolymer which becomes a body of a silica film.

The hydrolysis is desired to be carried out in the pH range of 1 to 4. As the pH adjusting agent, any acid is employable, and examples thereof include hydrochloric acid, hydrobromic acid, nitric acid and sulfuric acid.

Examples of the fluorine-containing trialkoxysilanes include trimethoxyfluorosilane, triethoxyfluorosilane, triisopropoxyfluorosilane and tributoxyfluorosilane. In particular, use of triethoxyfluorosilane is preferable. The fluorine-containing trialkoxysilanes can be used singly or in combination of two or more kinds.

Examples of the tetraalkoxysilanes include tetramethoxysilane, tetraethoxysilane, tetraisopropoxysilane and tetrabutylsilane. In particular, use of tetraethoxysilane is preferable.

The hydrolysis is carried out by adding a pH adjusting agent and water to the fluorine-containing trialkoxysilane and the tetraalkoxysilane. The amount of water added is in the range of preferably 0.5 to 20 mol based on 1 mol of the alkoxysilane, and the hydrolysis is desirably conducted at room temperature for several minutes to 5 hours.

The hydrolysis may be conducted in the presence of a solvent. Examples of the solvents employable include primary alcohols, such as methanol, ethanol and 1-propanol; secondary alcohols, such as 2-propanol and 2-butanol; tertiary alcohols, such as tertiary butyl alcohol; acetone; and acetonitrile. The solvents can be used singly or in combination of two or more kinds.

By changing the molar ratio of the fluorine-containing trialkoxysilane to the tetraalkoxysilane, the amounts of the fluorine atoms capable of being fixed in the silica skeleton can be changed. The fluorine content in the silica skeleton can be measured by elemental analysis. The fluorine content in the silica skeleton is in the range of preferably 0.3 to 15.0% by weight, more preferably 0.3 to 10.0% by weight, particularly preferably 0.5 to 7.0% by weight.

The crystal structure can be confirmed by X-ray diffractometry. In order to obtain water-repellent porous silica having a hexagonal periodic crystal structure and having pores of uniform sizes, the molar ratio of the fluorine-containing trialkoxysilane to the tetraalkoxysilane is in the range of preferably 0.01 to 1.2, more preferably 0.01 to 0.5, particularly preferably 0.05 to 0.3. If the molar ratio is less than the lower limit of the above range, the effect of water repellency cannot be obtained. If the molar ratio is more than the upper limit of the above range, the pore sizes become ununiform and a hexagonal periodic crystal structure cannot be formed occasionally. Even if the molar ratio is in the above range, a periodic crystal structure having microscopically hexagonal system formed by variation of the arrangement at short intervals but having no distinguishable peak found by X-ray diffractometry, namely, a crystal structure of so-called irregular arrangement is obtained depending upon the preparation conditions. Even in this case, however, the resulting silica has uniform pores having equal sizes.

The alkali metal present in the silica, even in a slight amount, hinders application of the silica to an electron functional material, so that the amount of the alkali metal contained in the silica is desired to be as small as possible. More specifically, the content of the alkali metal in the water-repellent porous silica is preferably not more than 10 ppb. The influence of the alkali metal can be generally judged by measuring electrical properties of a film or the like produced from the silica.

After the hydrolysis reaction of the fluorine-containing trialkoxysilane with the tetraalkoxysilane, a surface active agent is added, and the mixture is stirred for preferably several minutes to 5 hours, whereby a precursor solution for forming water-repellent porous silica can be obtained.

It is desirable to use a compound having a long-chain alkyl group and a hydrophilic group as the surface active agent. The long-chain alkyl group is preferably one having 8 to 24 carbon atoms. Examples of the hydrophilic groups include a quaternary ammonium salt, an amino group, a nitroso group, a hydroxyl group and a carboxyl group. Specifically, it is preferable to use an alkylammonium salt represented by the following formula:

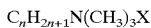

$$C_nH_{2n+1}N(CH_3)_3X$$

wherein n is an integer of 8 to 24, and X is a halide ion, $HSO_4^-$ or an organic anion.

By changing the molar ratio between the surface active agent added and the alkoxysilane, the crystal structure of the resulting water-repellent porous silica can be controlled.

When the surface active agent is an alkylammonium salt, the number of moles of the surface active agent is in the range of preferably 0.03 to 1 time, more preferably 0.05 to 0.2 time, the sum of the numbers of moles of the fluorine-containing trialkoxysilane and the tetraalkoxysilane. If the amount of the surface active agent is smaller than the above amount, extra silica incapable of contributing to self organization is present and the porosity is markedly lowered. If the amount of the surface active agent is larger than the above amount, a hexagonal periodic crystal structure having uniform pores cannot be formed, resulting in disadvantages such as disintegration of the structure during the calcining.

As the surface active agent, a compound having a polyalkylene oxide structure is also employable. Examples of the polyalkylene oxide structures include polyethylene oxide structure, polypropylene oxide structure, polytetramethylene oxide structure and polybutylene oxide structure. Examples of such compounds include ether type compounds, such as polyoxyethylene/polyoxypropylene block copolymer, polyoxyethylene polyoxypropylene alkyl ether, polyethylene alkyl ether and polyoxyethylene alkyl phenyl ether; and ether ester type compounds, such as polyoxyethylene glycerine fatty acid ester, polyoxyethylene sorbitan fatty acid ester, polyethylene sorbitol fatty acid ester, sorbitan fatty acid ester, propylene glycol fatty acid ester and sucrose fatty acid ester.

When the surface active agent is a compound having a polyalkylene oxide structure, the number of moles of the surface active agent is in the range of preferably 0.003 to 0.05 time, more preferably 0.005 to 0.03 time, the sum of the numbers of moles of the fluorine-containing trialkoxysilane and the tetraalkoxysilane. If the amount of the surface active agent is smaller than the above amount, extra silica incapable of contributing to self organization is present and the porosity is markedly lowered occasionally. If the amount of the surface active agent is larger than the above amount, a hexagonal periodic crystal structure having uniform pores cannot be formed, resulting in disadvantages such as disintegration of the structure during the removal of the surface active agent.

The surface active agent may be added in the form of a solid or a solution obtained by dissolving the surface active agent in a solvent or a hydrolysis solution of alkoxysilane.

The precursor solution obtained by the addition of the surface active agent is dried, and then the surface active agent is removed by calcining or extraction, whereby water-repellent porous silica can be obtained.

With the precursor solution, a substrate is coated, and the solution is dried. Then, the surface active agent is removed by calcining or extraction, whereby a water-repellent porous silica film can be obtained.

The drying conditions are not specifically restricted, and any condition is available as far as the solvent can be evaporated. When the desired water-repellent porous silica is a powder, the solution is preferably dried by spray drying.

Likewise, the calcining conditions are not specifically restricted, and any temperature is available as far as the surface active agent can be removed at that temperature. The calcining may be carried out in the atmosphere or inert gas, or in vacuo.

The porous silica obtained as above is applicable to a catalyst carrier or a filler.

The porous silica film obtained as above exhibits high water repellency and high transparency even when it is in a self-supporting state or it is bonded to a substrate, and hence the film is applicable to a light functional material or an electron functional material, such as layer insulation film, electron recording medium, transparent conductive film, solid electrolyte, light wave-guiding channel or color member for LCD. Particularly, the layer insulation film needs to have strength, heat resistance and low dielectric constant (high porosity), and the water-repellent porous silica film having such uniform pores is promising.

The term "water repellency" used herein means such a state that even if operations consisting of sufficiently exposing porous silica in the form of a film or a powder to a nitrogen atmosphere at a temperature of 25° C. and a relative humidity of 90% and then putting it back in a dry nitrogen atmosphere are repeated, the porous silica is substantially free from weight change or structure disintegration due to water adsorption. Therefore, small change in weight due to water adsorption means high water repellency, and hence the weight change is preferably as small as possible, particularly preferably not more than 3% by weight.

As the substrate on which a film of the water-repellent porous silica is formed, any material that is generally used is employable. Examples of the substrates include glass, quarts, silicon wafer and stainless steel. The substrate may have any shape such as a shape of plate or dish.

Examples of methods for coating the substrate include general ones such as spin coating, cast coating and dip coating. In case of spin coating, the substrate is placed on a spinner, then a sample is dropped on the substrate, and the substrate is rotated at 500 to 10000 rpm, whereby a water-repellent silica film having a uniform thickness can be obtained.

EXAMPLE

The present invention is further described with reference to the following examples.

Moisture Adsorption Test

In the examples, the moisture adsorption test was carried out in the following manner.

First, a specimen was calcined at 400° C. and then allowed to stand still in a stream of dry nitrogen at room temperature until a constant weight was reached. Next, the specimen was allowed to stand still in a nitrogen atmosphere for 10 minutes at a relative humidity of 90%. Then, the specimen was put back in a stream of dry nitrogen again and allowed to stand sill until a constant weight was reached. These operations were repeated 20 times, and when a constant weight was reached in the stream of dry nitrogen, the weight was measured. A difference between the measured weight and the initial weight was calculated to determine weight change.

Increase in the weight of the specimen in this moisture adsorption test means increase in the adsorbed water of the specimen, and small change in weight means high water repellency.

Example 1

Tetraethoxysilane (7.0 g), triethoxyfluorosilane (0.3 g) and 1-propanol (17 ml) were mixed and stirred. To the mixture, 0.4 ml of 1N hydrochloric acid and 2.0 ml of water were added, followed by further stirring. Then, 9.0 ml of 2-butanol was added, and the mixture was mixed with a solution of 0.95 g of cetyltrimethylammonium chloride in 4.5 ml of water. After stirring for 2 hours, a transparent homogeneous precursor solution was obtained. Several droplets of the precursor solution were placed on a surface of a glass plate, and the glass plate was rotated at 2000 rpm for 10 seconds to form a film on the glass plate surface. By the X-ray diffractometry, the film obtained was found to have a structure of periodic arrangement having a spacing of 3.5 nm.

By the X-ray diffractometry, further, the film was found to retain a structure of periodic arrangement having a spacing of 2.9 nm even after drying and then calcining at 400° C., and it was confirmed from a sectional photograph of the film that the pores had a hexagonal arrangement structure. As a result of measurement of a film thickness by a film thickness meter, the film proved to have a uniform thickness of 0.2 $\mu$m. In the moisture adsorption test of the film, the weight change was substantially 0% by weight, and this film proved to be a porous film having high water repellency.

Then, the porous film was saturated with water and allowed to adsorb water in a humidifier at 40° C. for 24 hours, followed by heating under vacuum. The amount of water liberated by the heating under vacuum was analyzed by a quadrupole mass spectrometer (referred to as a "Q-mass" hereinafter). As a result, water liberation was not observed, and from this, it was confirmed that water was not substantially adsorbed inside the film pores.

Comparative Example 1

A film was formed on a glass plate in the same manner as in Example 1, except that triethoxyfluorosilane was not added. By the X-ray diffractometry, the film was found to have a structure of periodic arrangement having a spacing of 2.8 nm after calcining at 400° C., and it was confirmed from a sectional photograph of the film that the pores had a hexagonal arrangement structure. In the moisture adsorption test of the film, the weight gradually increased, and a weight change of 8% by weight was observed after the completion of 20 times of the operations. From this result, it was confirmed that the film had poor water repellency and water was adsorbed by the film.

Then, the porous film was saturated with water and allowed to adsorb water in a humidifier at 40° C. for 24 hours, followed by heating under vacuum. The amount of water liberated by the heating under vacuum was analyzed by a Q-mass. As a result, water liberation was great, and from this, it was confirmed that water was adsorbed inside the film pores.

Example 2

A precursor solution prepared in the same manner as in Example 1 was subjected to spray drying to obtain a dry powder. By the X-ray diffractometry, the powder obtained was found to have a periodic hexagonal arrangement structure having a spacing of 3.5 nm. By the X-ray diffractometry, further, the powder was found to retain a periodic hexagonal structure having a spacing of 2.8 nm even after drying and then calcining at 400° C. Moreover, it was confirmed by the elemental analysis that fluorine atoms were present in the powder in amounts of 1.04% by weight and the amounts of sodium atoms were below the limit of detection (below 10 ppb). In the moisture adsorption test of the powder, the weight change was substantially 0% by weight, and this powder proved to be porous silica having high water repellency.

Then, the powder was saturated with water and allowed to adsorb water in a humidifier at 40° C. for 24 hours, followed by heating under vacuum. The amount of water liberated by the heating of the powder under vacuum was analyzed by a Q-mass. As a result, water liberation was not observed, and from this, it was confirmed that water was not substantially adsorbed inside the powder pores.

Comparative Example 2

Into a solution of 2.16 g of sodium hydroxide in 90 g of water, 6 g of silica was introduced, and they were stirred at 80° C. for 2 hours. To the solution, 18.2 g of cetyltrimethylammonium bromide was added, followed by stirring at room temperature for 1 hour. To the solution, a solution of 0.68 g of 40 wt % hydrofluoric acid in 90 g of water was further added. The mixture was stirred at room temperature for 2 hours and then allowed to stand at 100° C. for 3 days in an autoclave to prepare a powder. The powder was filtered, washed with a large amount of water, dried at 100° C. for one day and night and calcined at 550° C. for 10 hours in air. By the X-ray diffractometry, the powder obtained was found to have a periodic hexagonal structure having a spacing of 3.4 nm. Further, it was confirmed by the elemental analysis that fluorine atoms were contained in amounts of 0.68% by weight and sodium atoms were contained in amounts of 6.0 ppm in the powder.

Example 3

A film formed in the same manner as in Example 1 was dried, and then extraction of the surface active agent was carried out using an ethanol solvent. By the X-ray diffractometry, the film obtained was found to retain a structure of periodic arrangement having a spacing of 3.6 nm after the extraction, similarly to Example 1. As a result of measurement of a film thickness by a film thickness meter, the film proved to have a uniform thickness of 0.2 $\mu$m. In the moisture adsorption test of the film, the weight change was substantially 0% by weight, and this film proved to be a porous film having high water repellency.

Then, the film was saturated with water and allowed to adsorb water in a humidifier at 40° C. for 24 hours, followed by heating under vacuum. The amount of water liberated by the heating under vacuum was analyzed by a Q-mass. As a result, water liberation was not observed, and from this, it was confirmed that water was not substantially adsorbed inside the film pores.

Example 4

Several droplets of a precursor solution prepared in the same manner as in Example 1 were placed on a surface of an acetyl cellulose film, and the acetyl cellulose film was rotated at 2000 rpm for 10 seconds to form a film on the acetyl cellulose film surface. After drying at room temperature, the acetyl cellulose film was dissolved with methyl acetate to obtain a transparent self-supporting film. By the X-ray diffractometry, the self-supporting film obtained was found to have the same structure as that of Example 1.

Example 5

A film was formed in the same manner as in Example 1, except that the amount of cetyltrimethylammonium chloride was changed to 1.75 g from 0.95 g. By the X-ray diffractometry, the film obtained was found to have a periodic cubic structure. In the moisture adsorption test of the film, the weight change was substantially 0% by weight, and this film proved to be a porous film having high water repellency.

Then, the film was saturated with water and allowed to adsorb water in a humidifier at 40° C. for 24 hours, followed by heating under vacuum. The amount of water liberated by the heating under vacuum was analyzed by a Q-mass. As a result, water liberation was not observed, and from this, it was confirmed that water was not substantially adsorbed inside the film pores.

Example 6

A film was formed in the same manner as in Example 1, except that the amount of cetyltrimethylammonium chloride was changed to 0.75 g from 0.95 g. Although a regular structure was not confirmed by the X-ray diffractometry, it was confirmed from a sectional photograph of the film that the film had a structure of worm-like arrangement. In the moisture adsorption test of the film, the weight change was substantially 0% by weight, and this film proved to be a porous film having high water repellency.

Then, the film was saturated with water and allowed to adsorb water in a humidifier at 40° C. for 24 hours, followed by heating under vacuum. The amount of water liberated by the heating under vacuum was analyzed by a Q-mass. As a result, water liberation was not observed, and from this, it was confirmed that water was not substantially adsorbed inside the film pores.

Example 7

Tetraethoxysilane (10.0 g), triethoxyfluorosilane (0.5 g) and ethanol (50 ml) were mixed and stirred. To the mixture, 1.0 ml of 1N hydrochloric acid and 10.0 ml of water were added, followed by further stirring for 1 hour. Then, the mixture was mixed with a solution of 2.8 g of a poly (alkylene oxide) block copolymer (Pluronic P123, available from BASF, $HO(CH_2CH_2O)_{20}(CH_2CH(CH_3)O)_{70}(CH_2CH_2O)_{20}H$) in 60 ml of ethanol. After stirring for 2 hours, a transparent homogeneous precursor solution was obtained. Several droplets of the precursor solution were placed on a surface of a glass plate, and the glass plate was rotated at 2000 rpm for 10 seconds to form a film on the glass plate surface. By the X-ray diffractometry, the film obtained was found to have a structure of periodic arrangement having a spacing of 5.4 nm. By the X-ray diffractometry, further, the film was found to retain a structure of periodic arrangement having a spacing of 5.0 nm even after drying and then calcining at 400° C., and it was confirmed from a sectional photograph of the film that the pores had a hexagonal arrangement structure. As a result of measurement of a film thickness by a film thickness meter, the film proved to have a uniform thickness of 0.1 $\mu$m. In the moisture adsorption test of the film, the weight change was substantially 0% by weight, and this film proved to be a porous film having high water repellency.

Then, the porous film was saturated with water and allowed to adsorb water in a humidifier at 40° C. for 24 hours, followed by heating under vacuum. The amount of water liberated by the heating under vacuum was analyzed by a Q-mass. As a result, water liberation was not observed, and from this, it was confirmed that water was not substantially adsorbed inside the film pores.

Comparative Example 3

A film was formed on a glass plate in the same manner as in Example 7, except that triethoxyfluorosilane was not added. By the X-ray diffractometry, the film was found to have a structure of periodic arrangement, and it was confirmed from a sectional photograph of the film that the pores had a hexagonal arrangement structure. In the moisture adsorption test of the film, the weight gradually increased, and a weight change of 9% by weight was observed after the completion of 20 times of the operations. From this result, it was confirmed that the film had poor water repellency and water was adsorbed by the film.

Then, the porous film was saturated with water and allowed to adsorb water in a humidifier at 40° C. for 24 hours, followed by heating under vacuum. The amount of water liberated by the heating under vacuum was analyzed by a Q-mass. As a result, water liberation was great, and from this, it was confirmed that water was adsorbed inside the film pores.

Example 8

A precursor solution prepared in the same manner as in Example 7 was subjected to spray drying to obtain a dry powder. By the X-ray diffractometry, the powder obtained was found to have a structure of periodic arrangement having a spacing of 5.3 nm. By the X-ray diffractometry, further, the powder was found to retain a periodic hexagonal structure having a spacing of 4.9 nm even after drying and then calcining at 400° C. Moreover, it was confirmed by the elemental analysis that fluorine atoms were present in the powder in amounts of 1.36% by weight and the amounts of sodium atoms were below the limit of detection (below 10 ppb).

Example 9

A film formed in the same manner as in Example 7 was dried, and then extraction of the surface active agent was carried out using an ethanol solvent. By the X-ray diffractometry, the film obtained was found to retain a structure of periodic arrangement having a spacing of 5.4 nm after the extraction, similarly to Example 7. As a result of measurement of a film thickness by a film thickness meter, the film proved to have a uniform thickness of 0.1 $\mu$m. In the moisture adsorption test of the film, the weight change was substantially 0% by weight, and this film proved to be a porous film having high water repellency.

Then, the film was saturated with water and allowed to adsorb water in a humidifier at 40° C. for 24 hours, followed by heating under vacuum. The amount of water liberated by the heating under vacuum was analyzed by a Q-mass. As a result, water liberation was not observed, and from this, it was confirmed that water was not substantially adsorbed inside the film pores.

Example 10

Several droplets of a precursor solution prepared in the same manner as in Example 7 were placed on a surface of an acetyl cellulose film, and the acetyl cellulose film was rotated at 2000 rpm for 10 seconds to form a film on the acetyl cellulose film surface. After drying at room temperature, the acetyl cellulose film was dissolved with methyl acetate to obtain a transparent self-supporting film. By the X-ray diffractometry, the self-supporting film obtained was found to have the same structure as that of Example 7.

Example 11

Several droplets of a precursor solution prepared in the same manner as in Example 1 were placed on a low-resistance p type silicon wafer for dielectric constant measurement, and the silicon wafer was rotated at 2000 rpm for 10 seconds to form a film. By the X-ray diffractometry, the film was found to retain a structure of periodic arrangement having a spacing of 2.9 nm after calcining at 400° C., and it was confirmed from a sectional photograph of the film that the pores had a hexagonal arrangement structure.

Then, front and back surface electrodes were formed by deposition, and a dielectric constant was measured in a nitrogen atmosphere under the condition of a frequency of 1 MHz. As a result, the mean dielectric constant was 2.4 in the 10-point measuring method.

Comparative Example 4

A dielectric constant of a porous silica film obtained in the same manner as in Comparative Example 1 was measured. The measurement was made in the same manner as in Example 11. As a result, the dielectric constant was 3.5.

Example 12

Several droplets of a precursor solution prepared in the same manner as in Example 1 were placed on a surface of a silicon wafer of a transistor provided with a source/drain region and a gate electrode, and the transistor was rotated at 2000 rpm for 10 seconds to coat the silicon wafer with the precursor solution. Thereafter, the coating film was heated at 400° C. for 1 hour in a nitrogen atmosphere to obtain a layer insulation film. A sectional photograph of the layer insulation film was observed, and as a result, it was confirmed that the layer insulation film was a porous silica film having a spacing of about 3 nm and having pores with a periodic hexagonal arrangement structure.

EFFECT OF THE INVENTION

A water-repellent porous silica having uniform pores, that is applicable to a light functional material or an electron functional material, and a process for preparing the water-repellent porous silica can be provided by the present invention.

The water-repellent porous silica film according to the present invention can retain a periodic structure of pores by virtue of its water repellency, and as a result, the dielectric constant can be lowered. Therefore, the water-repellent porous silica film is favorable as a layer insulation film.

INDUSTRIAL APPLICABILITY

The water-repellent porous silica film of the invention can retain a periodic structure of pores by virtue of its water repellency, and has an alkali metal content of not more than 10 ppb. Hence, the water-repellent porous silica film is applicable to a catalyst carrier, an adsorbent, a light functional material, an electron functional material and the like. Moreover, by virtue of the water repellency, the dielectric constant can be lowered, so that the water-repellent porous silica film is particularly useful as a layer insulation film of a semiconductor or the like.

What is claimed is:

1. Water-repellent porous silica having uniform pores, which contains fluorine atoms fixed in the silica skeleton through covalent bonds and has an alkali metal content of not more than 10 ppb wherein the pores have a mean pore size of 1.3 to 10 nm.

2. The water-repellent porous silica as claimed in claim 1, wherein the fluorine content in the silica skeleton is in the range of 0.3 to 15.0% by weight.

3. The water-repellent porous silica as claimed in claim 1 or 2, which has a periodic crystal structure of hexagonal system when examined by X-ray diffractometry.

4. The water-repellent porous silica as claimed in claim 1 or 2, which has a crystal structure of irregular arrangement.

5. The water-repellent porous silica of claim 1 or 2, which is obtained by partially hydrolyzing a fluorine-containing trialkoxysilane represented by the following formula and a tetraalkoxysilane under acidic condition and then mixing the resulting hydrolysis solution with a surface active agent;

$$(ZO)_3SiR$$

wherein Z is methyl, ethyl, n-propyl, i-propyl, n-butyl, t-butyl, i-butyl or sec-butyl, and R is a fluorine atom, $(CH_2)_a(CF_2)_b(O(CF_2)_c)_dX$ (X is a fluorine atom, $OCF_3$, $OCF(CF_3)_2$, $OC(CF_3)_3$, an alkyl group or a phenyl group, a is a number of 0 to 3, b is a number of 0 to 3, c is a number of 1 to 3, and d is a number of 0 to 3) or $C_6H_eF_{(5-e)}$ (e is a number of 0 to 4).

6. A process for preparing water-repellent porous silica having uniform pores, which contains fluorine atmos fixed in the silica skeleton through covalent bonds and has an alkali metal content of not more than 10 ppb, comprising the steps of:

partially hydrolyzing a fluorine-containing trialkoxysilane represented by the following formula and a tetraalkoxysilane under acidic condition, mixing the resulting hydrolysis solution with a surface active agent, then drying the solution resulting from the hydrolysis and mixed with the surface active agent, and performing calcination or extraction;

$$(ZO)_3SiR$$

wherein Z is methyl, ethyl, n-propyl, i-propyl, n-butyl, t-butyl, i-butyl or sec-butyl, and R is a fluorine atom, $(CH_2)_a(CF_2)_b(O(CF_2)_c)_dX$ (X is a fluorine atom, $OCF_3$, $OCF(CF_3)_2$, $OC(CF_3)_3$, an alkyl group or a phenyl group, a is a number of 0 to 3, b is a number of 0 to 3, c is a number of 1 to 3, and d is a number of 0 to 3) or $C_6H_eF_{(5-e)}$ (e is a number of 0 to 4).

7. The process for preparing the water-repellent porous silica as claimed in claim 6, wherein the solution is dried by spray drying.

8. The process for preparing the water-repellent porous silica as claimed in claim 6 or 7, wherein the fluorine-containing trialkoxysilane is triethoxyfluorosilane.

9. The process for preparing the water-repellent porous silica as claimed in claim 6 or 7, wherein the tetraalkoxysilane is tetraethoxysilane.

10. The process for preparing the water-repellent porous silica as claimed in claim 6 or 7, wherein the molar ratio of the fluorine-containing trialkoxysilane to the tetraalkoxysilane is in the range of 0.01 to 1.2.

11. The process for preparing the water-repellent porous silica as claimed in claim 6 or 7, wherein the number of moles of the surface active agent is in the range of 0.003 to 1 times the sum of the number of moles of the fluorine-containing trialkoxysilane and the tetraalkoxysilane.

12. The process for preparing the water-repellent porous silica as claimed in claim 6 or 7, wherein the surface active agent is an alkylammonium salt represented by the following formula:

$$C_nH_{2n+1}N(CH_3)_3X$$

wherein n is an integer of 8 to 24, and X is a halide ion, $HSO_4^-$ or an organic anion.

13. The process for preparing the water-repellent porous silica as claimed in claim 6 or 7, wherein the surface active agent is a compound having a polyalkylene oxide structure.

14. A film comprising the water-repellent porous silica of claim 1.

15. The film as claimed in claim 14, which has a thickness of 0.01 µm to 2.0 mm.

16. A layer insulation film comprising the film of claim 14 or 15.

17. A precursor solution for forming water-repellent porous silica, which is obtained by partially hydrolyzing a fluorine-containing trialkoxysilane represented by the following formula and a tetraalkoxysilane under acidic condition and then mixing the resulting hydrolysis solution with a surface active agent;

$$(ZO)_3SiR$$

wherein Z is methyl, ethyl, n-propyl, i-propyl, n-butyl, t-butyl, i-butyl or sec-butyl, and R is a fluorine atom, $(CH_2)_a(CF_2)_b(O(CF_2)_c)_dX$ (X is a fluorine atom, $OCF_3$, $OCF(CF_3)_2$, $OC(CF_3)_3$, an alkyl group or a phenyl group, a is a number of 0 to 3, b is a number of 0 to 3, c is a number of 1 to 3, and d is a number of 0 to 3) or $C_6H_eF_{(5-e)}$ (e is a number of 0 to 4).

18. The precursor solution for forming water-repellent porous silica as claimed in claim 17, wherein the molar ratio of the fluorine-containing trialkoxysilane to the tetraalkoxysilane is in the range of 0.01 to 1.2.

19. The precursor solution for forming water-repellent porous silica as claimed in claim 17, wherein the number of moles of the surface active agent is in the range of 0.003 to 1 times the sum of the numbers of moles of the fluorine-containing trialkoxysilane and the tetraalkoxysilane.

20. The precursor solution for forming water-repellent porous silica as claimed in claim 17, wherein the surface active agent is an alkylammonium salt represented by the following formula:

$$C_nH_{2n+1}N(CH_3)_3X$$

wherein n is an integer of 8 to 24, and X is a halide ion, $HSO_4^-$ or an organic anion.

21. The precursor solution for forming water-repellent porous silica as claimed in claim 17, wherein the surface active agent is a compound having a polyalkylene oxide structure.

* * * * *